United States Patent
Yamashita

(10) Patent No.: US 9,704,877 B2
(45) Date of Patent: Jul. 11, 2017

(54) SEMICONDUCTOR MEMORY DEVICE

(71) Applicant: Kabushiki Kaisha Toshiba, Minato-ku (JP)

(72) Inventor: Hiroki Yamashita, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/046,655

(22) Filed: Feb. 18, 2016

(65) Prior Publication Data
US 2017/0062465 A1    Mar. 2, 2017

Related U.S. Application Data

(60) Provisional application No. 62/212,033, filed on Aug. 31, 2015.

(51) Int. Cl.
H01L 29/792 (2006.01)
H01L 27/11582 (2017.01)
H01L 29/49 (2006.01)

(52) U.S. Cl.
CPC .... *H01L 27/11582* (2013.01); *H01L 29/4966* (2013.01)

(58) Field of Classification Search
CPC ......... H01L 27/11582; H01L 29/66833; H01L 29/7926; H01L 29/4966
USPC ...................... 257/324, 66, 369; 1/1; 365/63
See application file for complete search history.

(56) References Cited

U.S. PATENT DOCUMENTS

| | | | | |
|---|---|---|---|---|
| 8,829,593 B2* | 9/2014 | Sekine | ............... | H01L 27/11551 257/324 |
| 8,847,302 B2* | 9/2014 | Alsmeier | .......... | H01L 21/28282 257/316 |
| 8,907,400 B2 | 12/2014 | Lee et al. | | |
| 9,136,468 B2* | 9/2015 | Nakai | ...................... | H01L 45/06 |
| 9,401,371 B1* | 7/2016 | Lee | ................... | H01L 27/11582 |
| 9,412,749 B1* | 8/2016 | Shimabukuro | ... | H01L 27/11575 |
| 9,419,011 B2* | 8/2016 | Lee | ................... | H01L 27/11565 |
| 2014/0048868 A1* | 2/2014 | Kim | ..................... | H01L 29/7926 257/324 |
| 2014/0063890 A1* | 3/2014 | Lee | ................... | H01L 27/11519 365/63 |

(Continued)

FOREIGN PATENT DOCUMENTS

JP    2014-195034    10/2014

*Primary Examiner* — Mohammed Shamsuzzaman
(74) *Attorney, Agent, or Firm* — Oblon, McClelland, Maier & Neustadt, L.L.P.

(57) ABSTRACT

A semiconductor memory device includes a first stacked body, a semiconductor pillar extending the first direction and piercing the first stacked body, and a memory film disposed between the semiconductor pillar and the electrode film. The first stacked body includes a plurality of electrode films and a plurality of inter-layer insulating films stacked alternately along the first direction. The plurality of electrode films and the plurality of inter-layer insulating films extend in a second direction intersecting the first direction. Each of the electrode films includes a central portion and a peripheral portion. The central portion is disposed in a central part of the electrode film in a third direction, and includes silicon. The third direction intersects the first direction and the second direction. The peripheral portion is disposed on two sides of the central portion in the third direction, extends in the second direction and includes a metal.

8 Claims, 16 Drawing Sheets

(56) References Cited

U.S. PATENT DOCUMENTS

| | | | |
|---|---|---|---|
| 2014/0097484 A1 | 4/2014 | Seol et al. | |
| 2015/0069494 A1* | 3/2015 | Makala | H01L 21/28273 257/321 |
| 2015/0102346 A1* | 4/2015 | Shin | H01L 27/1157 257/66 |
| 2015/0279850 A1* | 10/2015 | Takaki | H01L 27/11524 257/369 |
| 2016/0086964 A1* | 3/2016 | Chien | H01L 27/11556 257/314 |
| 2016/0099250 A1* | 4/2016 | Rabkin | H01L 27/11582 257/66 |
| 2016/0260735 A1* | 9/2016 | Lee | H01L 27/11582 |

* cited by examiner

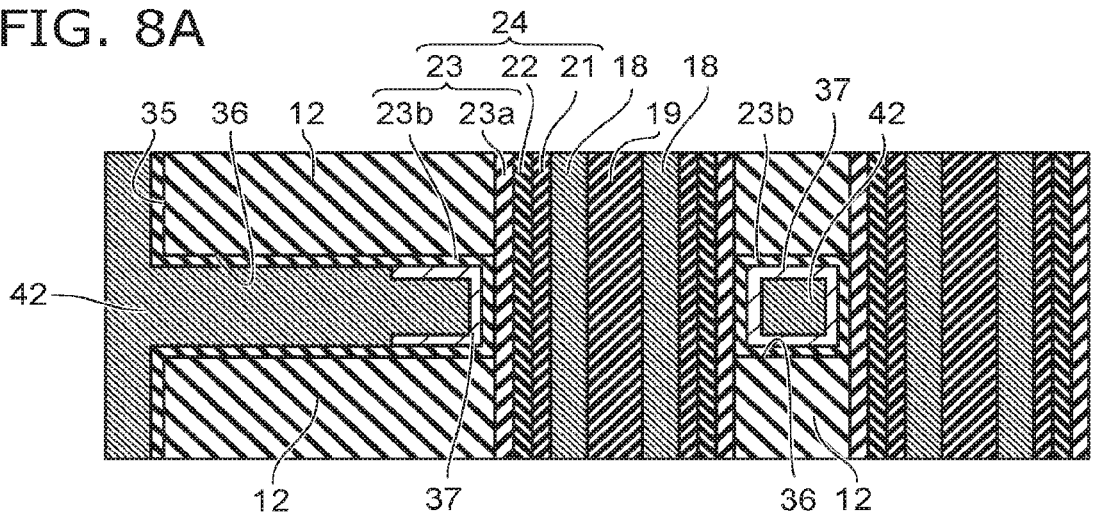
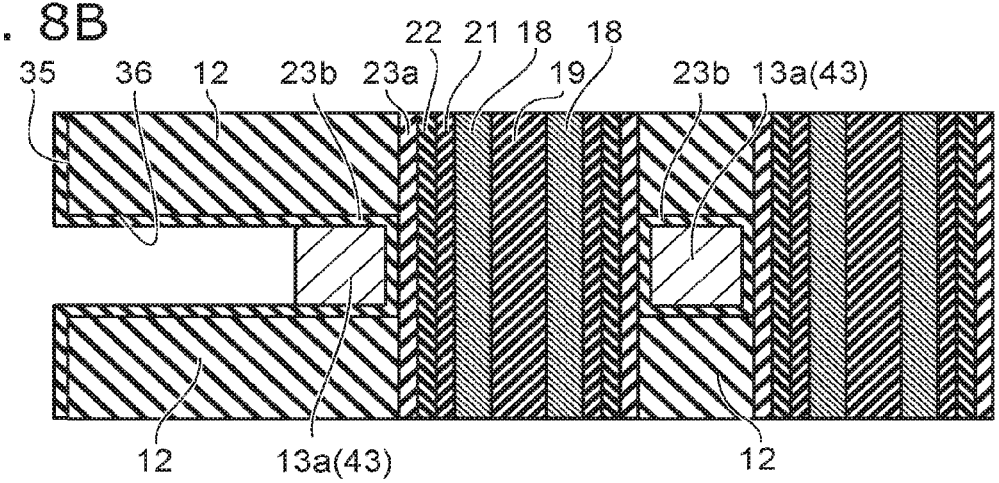
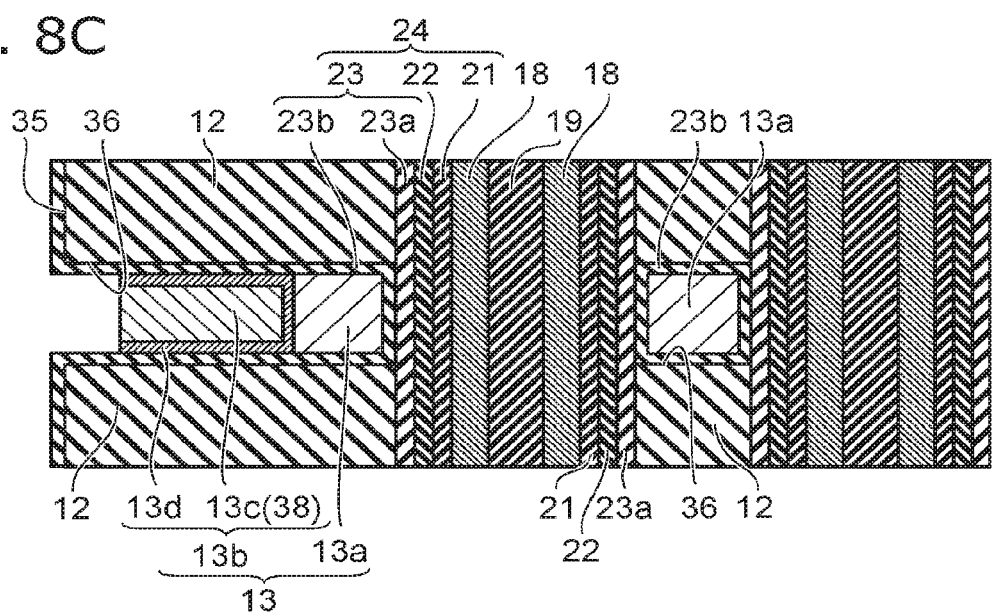

SEMICONDUCTOR MEMORY DEVICE

CROSS-REFERENCE TO RELATED APPLICATIONS

This application is based upon and claims the benefit of priority from U.S. Provisional Patent Application 62/212,033, filed on Aug. 31, 2015; the entire contents of which are incorporated herein by reference.

FIELD

Embodiments relate to a semiconductor memory device.

BACKGROUND

In recent years, a stacked type semiconductor memory device has been developed in which memory cells are integrated three-dimensionally. In the stacked type semiconductor memory device as well, even more downscaling is necessary to further increase the integration. Because the interconnect resistance increases as the interconnects are downscaled, technology has been proposed for forming the interconnects of a metal.

BRIEF DESCRIPTION OF THE DRAWINGS

FIG. 7A to FIG. 8C are cross-sectional views showing a method for manufacturing a semiconductor memory device according to a modification of the first embodiment;

DETAILED DESCRIPTION

A semiconductor memory device according to an embodiment includes a first stacked body, a semiconductor pillar extending in a first direction and piercing the first stacked body, and a memory film. The first stacked body includes a plurality of electrode films and a plurality of inter-layer insulating films stacked alternately along a first direction. The plurality of electrode films and the plurality of inter-layer insulating films extend in a second direction intersecting the first direction. Each of the electrode films includes a central portion and a peripheral portion. The central portion is disposed in a central part of the electrode film in a third direction, and includes silicon. The third direction intersects the first direction and the second direction. The peripheral portion is disposed on two sides of the central portion in the third direction, extends in the second direction and includes a metal. The memory film is disposed between one of the semiconductor pillars and one of the electrode films.

Embodiments of the invention will now be described with reference to the drawings. All of the drawings illustrated hereinbelow are schematic. For example, for easier viewing of the drawings, some of the components are not shown or reduced numbers of components are illustrated in some of the drawings. Also, the numbers and dimensional ratios of the components do not always match between the drawings.

First Embodiment

First, a first embodiment will be described.

Figure 1:
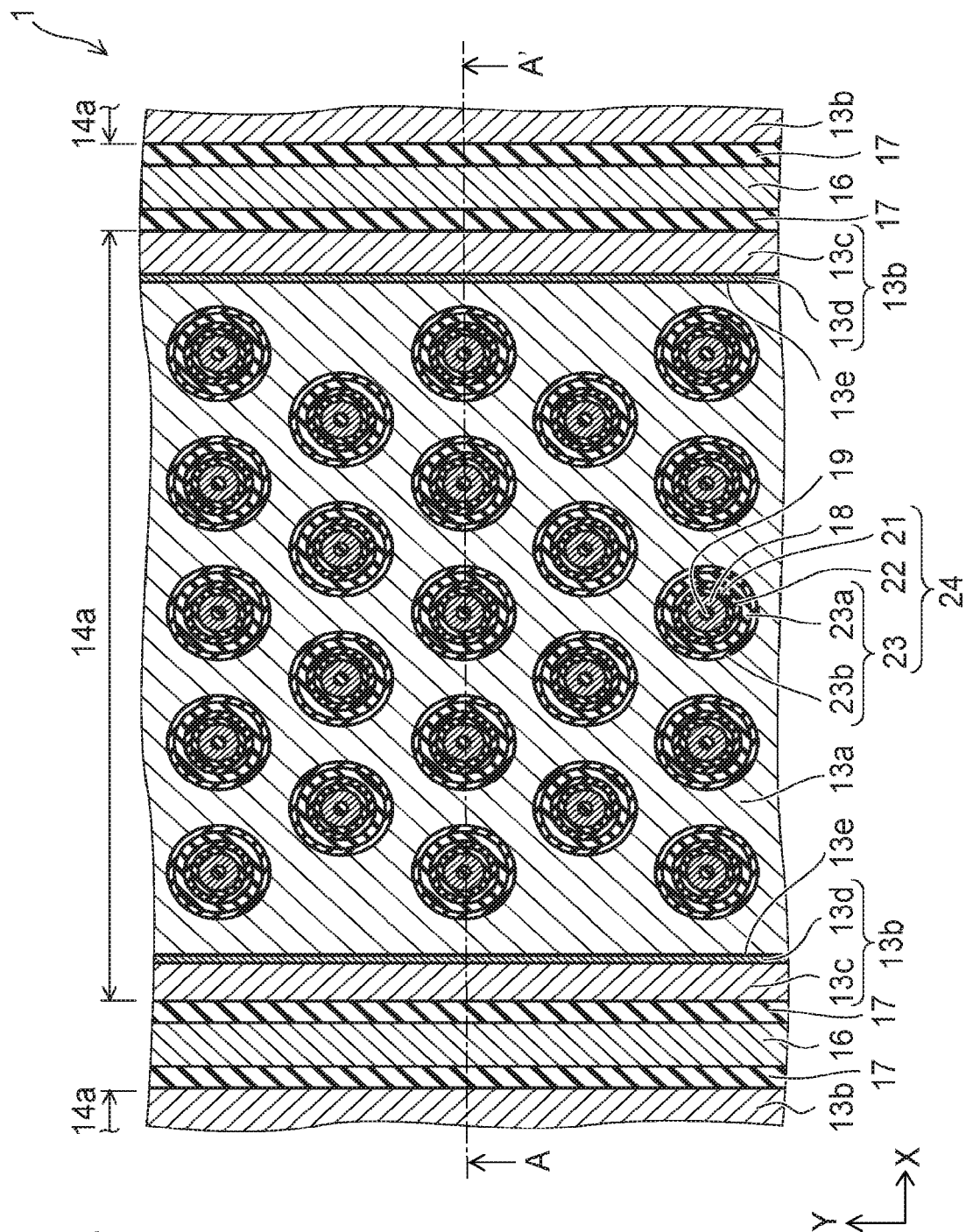
FIG. 1 to FIG. 3 are cross-sectional views showing a semiconductor memory device according to a first embodiment.
Figure 2:
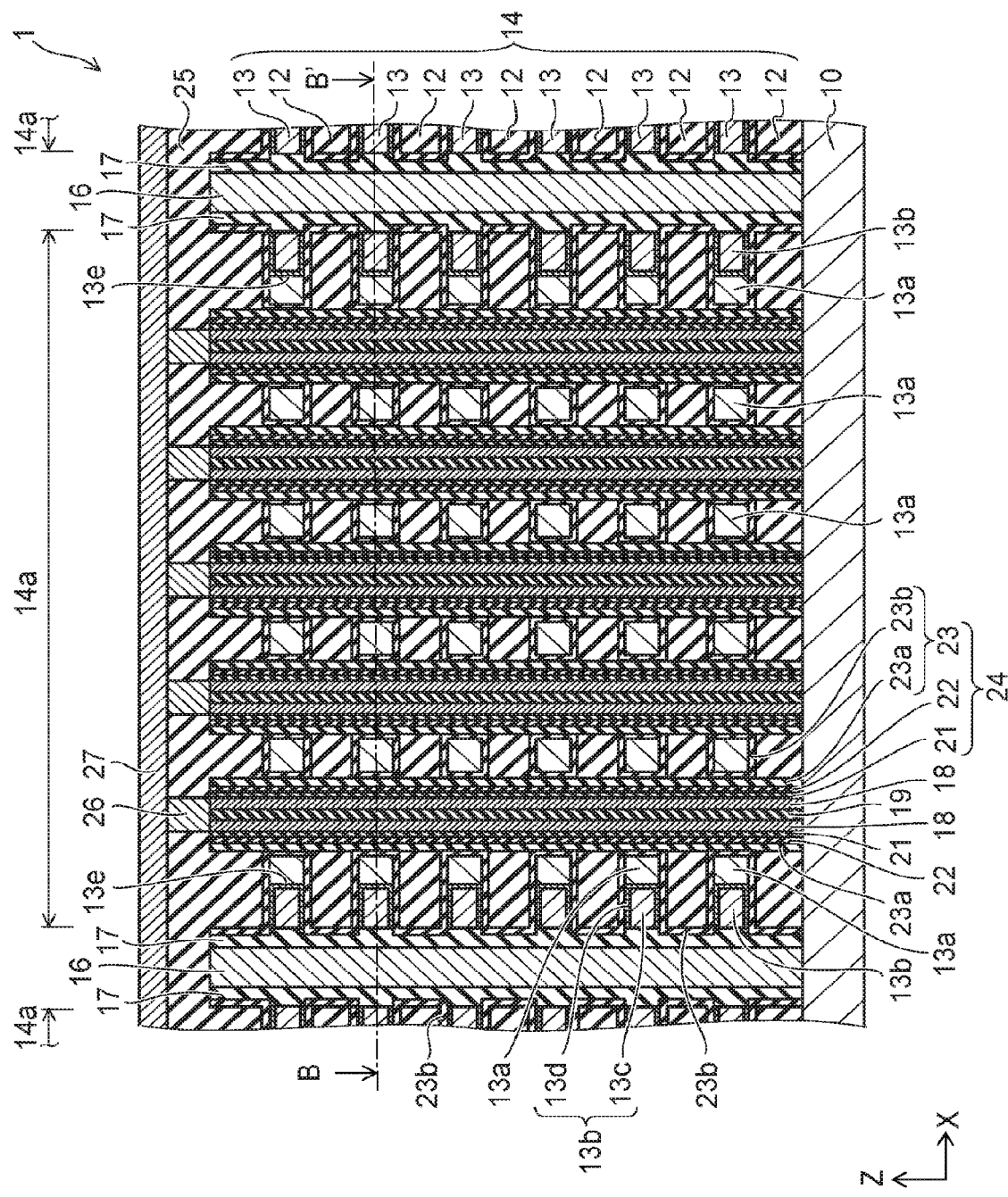

FIG. 1 and FIG. 2 are cross-sectional views showing a semiconductor memory device according to the embodiment.

FIG. 1 shows a cross section along line B-B' shown in FIG. 2; and FIG. 2 shows a cross section along line A-A' shown in FIG. 1.

As shown in FIG. 1 and FIG. 2, a silicon substrate 10 is provided in the semiconductor memory device 1 according to the embodiment. Hereinbelow, an XYZ orthogonal coordinate system is employed for convenience of description in the specification. Two mutually-orthogonal directions parallel to the upper surface of the silicon substrate 10 are taken as an "X-direction" and a "Y-direction;" and a direction perpendicular to the upper surface of the silicon substrate 10 is taken as a "Z-direction."

A stacked body 14 in which inter-layer insulating films 12 and electrode films 13 are stacked alternately along the Z-direction is provided on the silicon substrate 10. For example, the inter-layer insulating films 12 are formed of an insulating material such as silicon oxide ($SiO_2$), etc. The electrode films 13 are formed of a conductive material; and the detailed configuration of the electrode films 13 is described below.

Multiple source electrodes 16 that extend in the Y-direction and are separated from each other are provided inside the stacked body 14. The configurations of the source electrodes 16 are band configurations spreading along the YZ plane; the source electrodes 16 pierce the stacked body 14 in the Z-direction; and the lower ends of the source electrodes 16 are connected to the silicon substrate 10. Insulating members 17 having plate configurations made of, for example, silicon oxide are provided on the two side surfaces of each of the source electrodes 16. Thereby, the stacked body 14 is subdivided by the source electrodes 16 and the insulating members 17 into partial stacked bodies 14a having multiple band configurations.

In other words, the partial stacked body 14a in which the multiple electrode films 13 and the multiple inter-layer insulating films 12 are stacked alternately along the Z-direction is provided between a pair of mutually-adjacent insulating members 17. The multiple partial stacked bodies 14a are arranged to be separated from each other along the X-direction. The partial stacked bodies 14a may be linked at the end parts in the Y-direction. The electrode film 13 of the uppermost level and the electrode film 13 of the lowermost level of the partial stacked body 14a respectively function as an upper selection gate electrode and a lower selection gate electrode extending in the Y-direction; and the other electrode films 13 function as word lines extending in the Y-direction.

In the semiconductor memory device 1, multiple silicon pillars 18 that extend in the Z-direction are provided and pierce the partial stacked body 14a. The silicon pillars 18 pierce the electrode films 13 and the inter-layer insulating films 12; and the lower ends of the silicon pillars 18 are connected to the silicon substrate 10. When viewed from the Z-direction, for example, the silicon pillars 18 are arranged in a staggered configuration. The configurations of the silicon pillars 18 are cylindrical configurations; and insulating members 19 are provided inside the silicon pillars 18. For example, the insulating members 19 are formed of silicon oxide; and the configurations of the insulating members 19 are circular columnar configurations extending in the Z-direction. The configurations of the silicon pillars 18 may be circular columns; and the insulating members 19 may not be provided.

A tunneling insulating film 21 is provided on the side surface of the silicon pillar 18. Although the tunneling insulating film 21 normally is insulative, the tunneling insulating film 21 is a film in which a tunneling current flows when a prescribed voltage within the range of the drive voltage of the semiconductor memory device 1 is applied and is, for example, a single-layer silicon oxide film or an ONO film in which a silicon oxide layer, a silicon nitride layer, and a silicon oxide layer are stacked. A charge storage film 22 is provided on the tunneling insulating film 21. The charge storage film 22 is a film that can store charge, is formed of, for example, a material that has trap sites of electrons, and is formed of, for example, silicon nitride ($Si_3N_4$).

A silicon oxide layer 23a that is made of silicon oxide is provided on the charge storage film 22. An aluminum oxide layer 23b that is made of aluminum oxide ($Al_2O_3$) is provided between the silicon oxide layer 23a and the electrode films 13, between the inter-layer insulating films 12 and the electrode films 13, and between the insulating member 17 and the inter-layer insulating films 12. The silicon oxide layer 23a and the aluminum oxide layer 23b make up a blocking insulating film 23. The blocking insulating film 23 is a film in which a current substantially does not flow even when a voltage within the range of the drive voltage of the semiconductor memory device 1 is applied. A memory film 24 that is capable of storing information includes the tunneling insulating film 21, the charge storage film 22, and the blocking insulating film 23. Accordingly, the memory film 24 is disposed between the silicon pillar 18 and the electrode films 13.

An inter-layer insulating film 25 is provided on the stacked body 14; and plugs 26 are provided inside the inter-layer insulating film 25. The lower ends of the plugs 26 are connected to the silicon pillars 18. Multiple bit lines 27 that extend in the X-direction are provided on the inter-layer insulating film 25. The bit lines 27 are connected to the upper ends of the plugs 26.

Then, one central portion 13a and two peripheral portions 13b are provided in each of the electrode films 13 in each of the partial stacked bodies 14a. The central portion 13a is disposed in the X-direction central part of the electrode film 13, extends in the Y-direction, and is formed of, for example, polysilicon (Si). On the other hand, the peripheral portions 13b are disposed at two X-direction end parts of the electrode film 13 and extend in the Y-direction. A main body unit 13c and a barrier metal layer 13d are provided in the peripheral portion 13b. For example, the main body unit 13c is made of a metal such as tungsten (W), etc. For example, the barrier metal layer 13d is formed of titanium nitride (TiN). The silicon pillars 18 pierce the central portions 13a of the electrode films 13.

By such a configuration, in the semiconductor memory device 1, the silicon pillars 18 are connected between the source electrodes 16 and the bit lines 27. Also, a memory cell transistor is formed, with the memory film 24 interposed, at each intersection between the silicon pillars 18 and the electrode films 13. Also, NAND strings in which multiple memory cell transistors are connected in series are formed between the source electrodes 16 and the bit lines 27.

Figure 3:
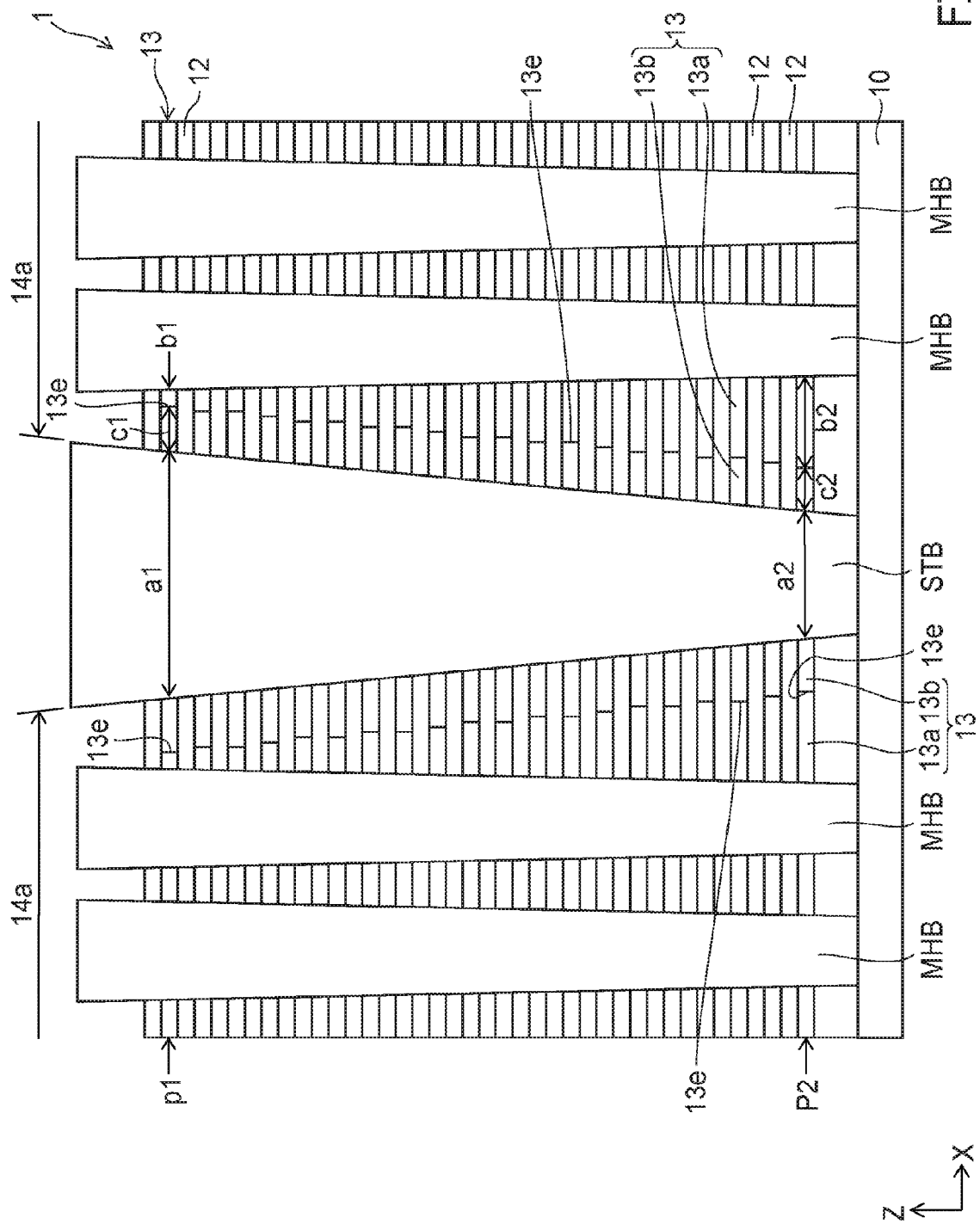

FIG. 3 is a cross-sectional view showing the semiconductor memory device according to the embodiment.

FIG. 3 shows a state in which the position of an interface 13e between the central portion 13a and the peripheral portion 13b is dependent on the position in the Z-direction. In FIG. 3, a circular columnar structure body that includes the insulating member 19, the silicon pillar 18, the tunneling insulating film 21, the charge storage film 22, and the silicon oxide layer 23a is shown as a memory hole structure body MHB; and a structure body that has the plate configuration and is made of the source electrode 16 and the insulating members 17 is shown as a slit structure body STB.

As shown in FIG. 3, the thickness in the X-direction of the slit structure body STB is not always uniform and, for example, is thick at the upper portion and becomes thinner downward, that is, toward the silicon substrate 10 side. Such a configuration occurs due to the etching when making a slit ST in a manufacturing process described below.

A distance b1 is shorter than a distance b2 in the case where a distance a1 is longer than a distance a2, where the width of the slit structure body STB, i.e., the distance between the partial stacked bodies 14a adjacent to each other in the X-direction, at a position p1 in the Z-direction is a1, the width of the slit structure body STB, i.e., the distance between the partial stacked bodies 14a adjacent to each other in the X-direction, at a position p2 is a2, the interface 13e is the interface between the central portion 13a and the peripheral portion 13b of the electrode film 13, the distance b1 is the distance between the interface 13e and the memory hole structure body MHB most proximal to the interface 13e at the position p1, and the distance b2 is the distance between the interface 13e and the memory hole structure body MHB most proximal to the interface 13e at the position p2. In other words, if a1>a2, b1<b2.

Because the thicknesses of the tunneling insulating film 21, the charge storage film 22, and the silicon oxide layer 23a are sufficiently thin compared to the distances b1 and b2, the distance b1 and the distance b2 are substantially equal to a distance b1' and a distance b2' between the interface 13e and the silicon pillar 18 most proximal to the interface 13e. Accordingly, if a1>a2, b1'<b2'.

On the other hand, a distance c1 between the interface 13e and the slit structure body STB at the position p1 is substantially equal to a distance c2 between the interface 13e and the slit structure body STB at the position p2. In other words, c1≈c2. This is caused by the isotropy when etching the electrode films 13 from the slit ST side in a manufacturing process described below.

The position p1 is higher than the position p2 in the example shown in FIG. 3. In other words, the position p2 is positioned between the silicon substrate 10 and the position p1. However, this is not limited thereto; and there are also cases where, for example, the configuration of the slit structure body STB is a bowed configuration. In such a case, the width in the X-direction of the slit structure body STB has a maximum value at a middle position in the Z-direction; and the width decreases from the middle position downward and upward. In such a case, the position p2 may be set to be higher than the position p1 as well.

A method for manufacturing the semiconductor memory device according to the embodiment will now be described.

FIG. 4A to FIG. 4D, FIG. 5A to FIG. 5D, FIG. 6A, and FIG. 6B are cross-sectional views showing the method for manufacturing the semiconductor memory device according to the embodiment.

First, the silicon substrate 10 is prepared as shown in FIG. 2. The silicon substrate 10 is, for example, a portion of a silicon wafer.

Figure 4A:
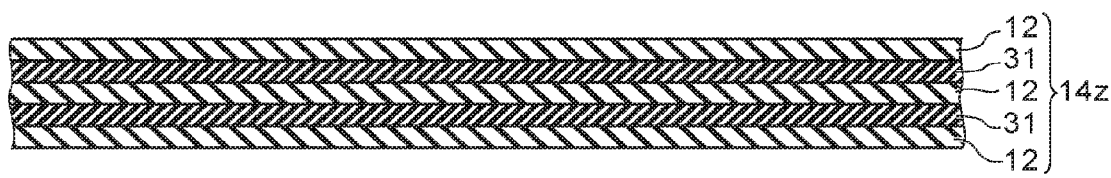
FIG. 4A to FIG. 6B are cross-sectional views showing a method for manufacturing the semiconductor memory device according to the first embodiment.

Then, as shown in FIG. 4A, a stacked body 14z is formed on the silicon substrate 10 (referring to FIG. 2) by stacking the inter-layer insulating films 12 and sacrificial films 31 alternately along the Z-direction by, for example, CVD (Chemical Vapor Deposition). For example, the inter-layer insulating films 12 are formed of silicon oxide. The sacrificial films 31 are formed of a material having etching selectivity with respect to the inter-layer insulating films 12 and is formed of, for example, silicon nitride.

Figure 4B:
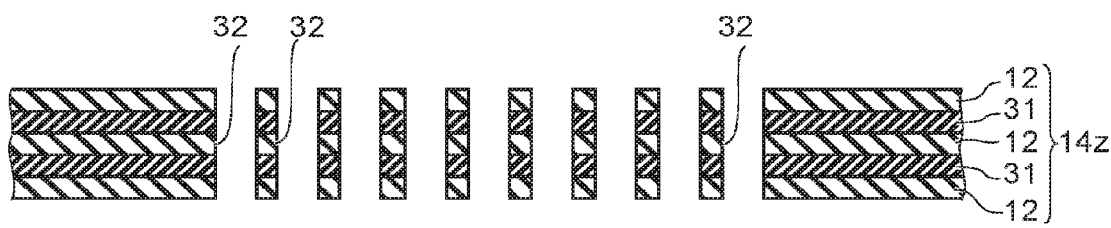

Then, as shown in FIG. 4B, multiple memory holes 32 are made in the stacked body 14z by, for example, RIE (Reactive Ion Etching). The memory holes 32 extend in the Z-direction, pierce the stacked body 14z, and reach the silicon substrate 10. When viewed from the Z-direction, the configurations of the memory holes 32 are circles. Also, when viewed from the Z-direction, for example, the memory holes 32 are disposed in a staggered configuration.

Figure 4C:
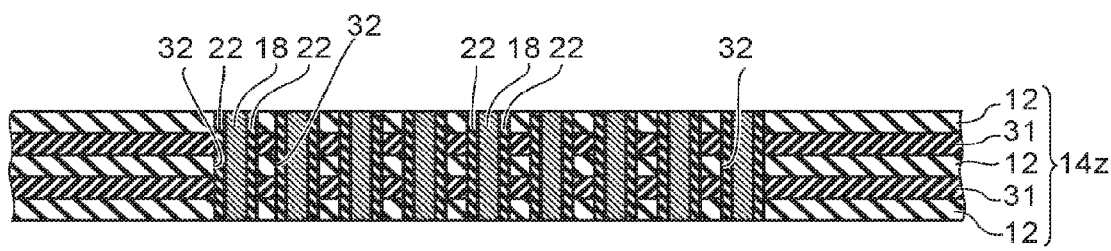

Then, as shown in FIG. 4C, for example, the silicon oxide layer 23a (referring to FIG. 2) is formed by depositing silicon oxide on the inner surfaces of the memory holes 32 by CVD; then, the charge storage film 22 is formed by depositing silicon nitride; and then, the tunneling insulating film 21 (referring to FIG. 2) is formed by depositing, for example, an ONO film. Among the components formed inside the memory holes 32, only the charge storage film 22 is shown in FIG. 4C to simplify the drawing. This is similar also for the other drawings described below.

Then, the silicon pillar 18 that has a cylindrical configuration is formed by depositing silicon on the inner surface of the tunneling insulating film 21. Then, the insulating member 19 (referring to FIG. 2) is filled by depositing silicon oxide on the inner surface of the silicon pillar 18. Thereby, the memory holes 32 are filled.

Figure 4D:
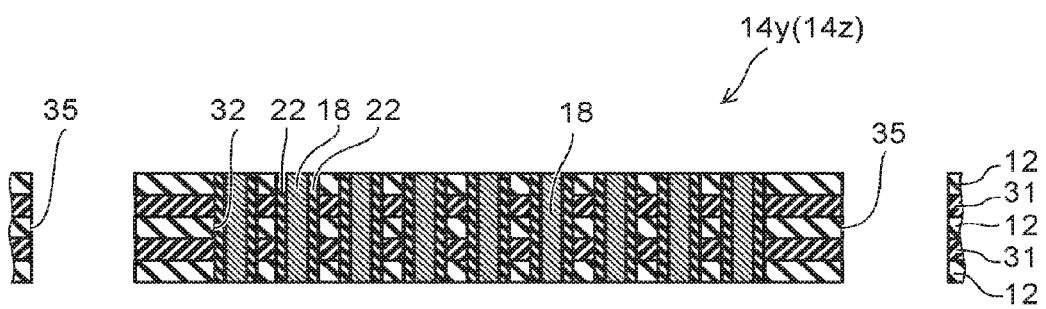

Then, as shown in FIG. 4D, multiple slits 35 that extend in the Y-direction are made in the stacked body 14z by, for example, anisotropic etching such as RIE, etc. The slits 35 pierce the stacked body 14z. Thereby, the stacked body 14z is divided into multiple partial stacked bodies 14y by the slits 35. The multiple silicon pillars 18 that are disposed in the staggered configuration are disposed in the X-direction central part of each of the partial stacked bodies 14y. Due to the conditions of the anisotropic etching, as shown in FIG. 3, the configuration of the slit 35 in the XZ cross section is an inverted trapezoidal configuration in which the width of the upper portion is wide and the width of the lower portion is narrow. Or, the configuration is a bowed configuration in which the width is widest at the middle position in the Z-direction.

Figure 5A:
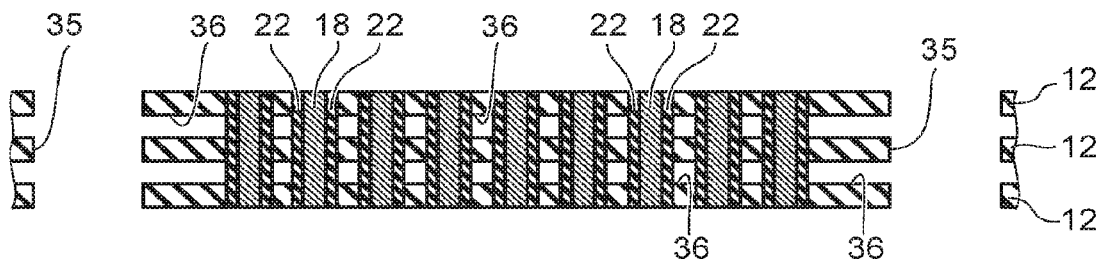

Then, as shown in FIG. 5A, the sacrificial films 31 (referring to FIG. 4D) are removed by performing wet etching via the slit 35. Thereby, spaces 36 are made between the inter-layer insulating films 12 adjacent to each other in the Z-direction.

Figure 5B:
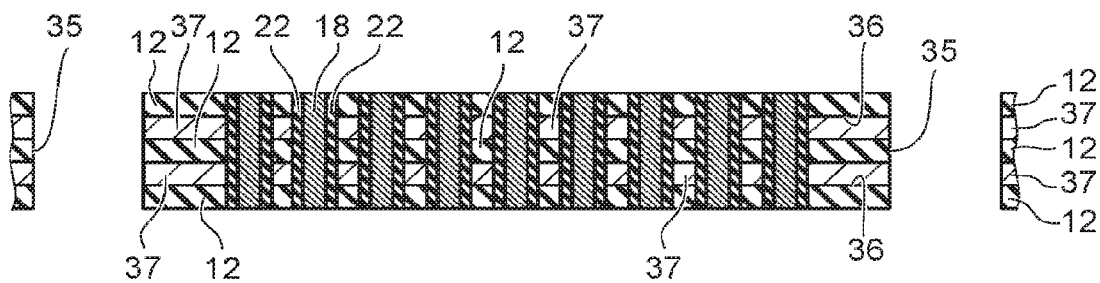

Then, as shown in FIG. 5B, the aluminum oxide layer 23b (referring to FIG. 2) is formed via the slit 35 on the side surface of the slit 35 and on the inner surfaces of the spaces 36. As shown in FIG. 2, the blocking insulating film 23 is formed of the silicon oxide layer 23a and the aluminum oxide layer 23b. Also, the memory film 24 is formed of the blocking insulating film 23, the charge storage film 22, and the tunneling insulating film 21. Then, silicon films 37 are filled into the spaces 36 via the slit 35 by depositing amorphous silicon by, for example, CVD.

Figure 5C:
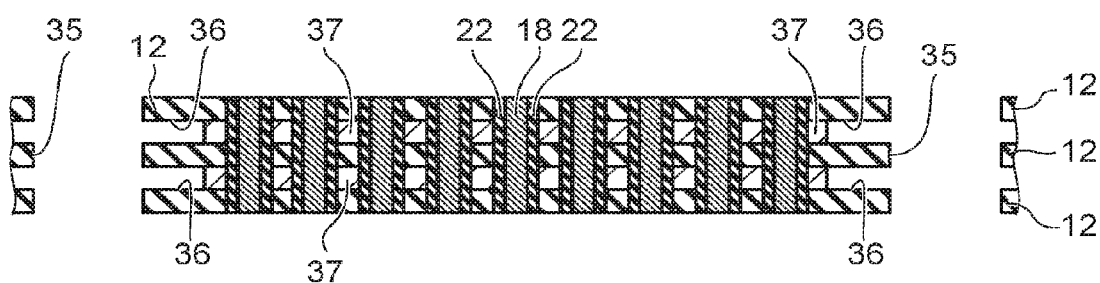
Figure 6A:
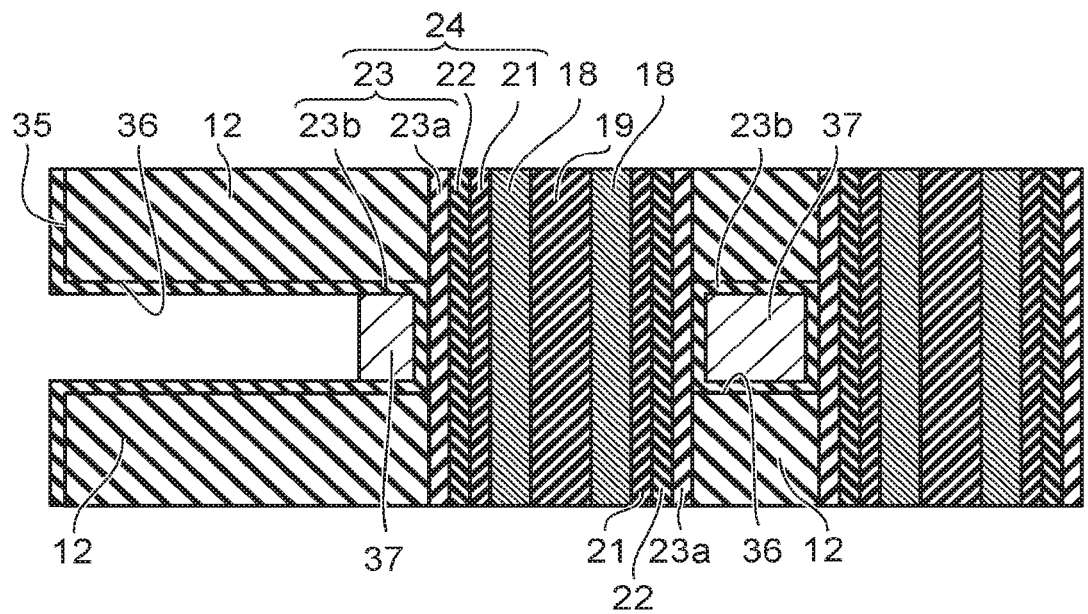

Then, as shown in FIG. 5C and FIG. 6A, the silicon films 37 are recessed via the slit 35 by performing isotropic etching such as wet etching, etc. Thereby, the silicon films 37 that are inside the X-direction peripheral portions of the spaces 36, i.e., the portions on the slit 35 side, are removed; and the silicon films 37 remain inside the X-direction central parts of the spaces 36. At this time, the receded amount of the silicon film 37 is substantially uniform regardless of the position in the Z-direction.

Figure 5D:
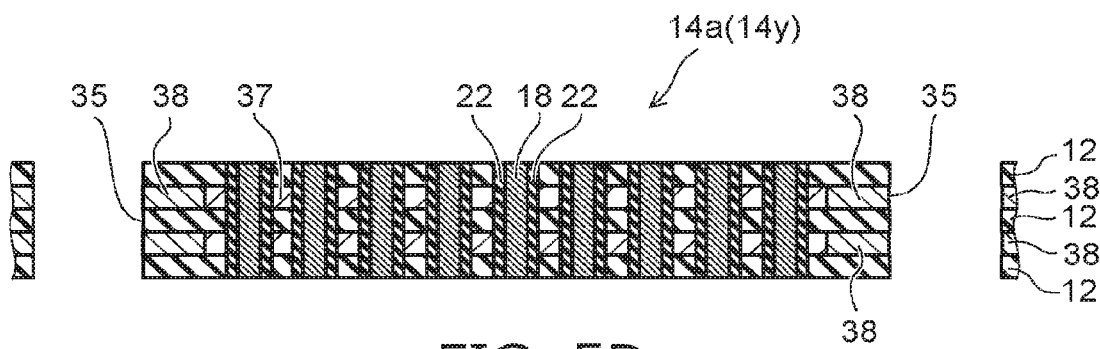
Figure 6B:
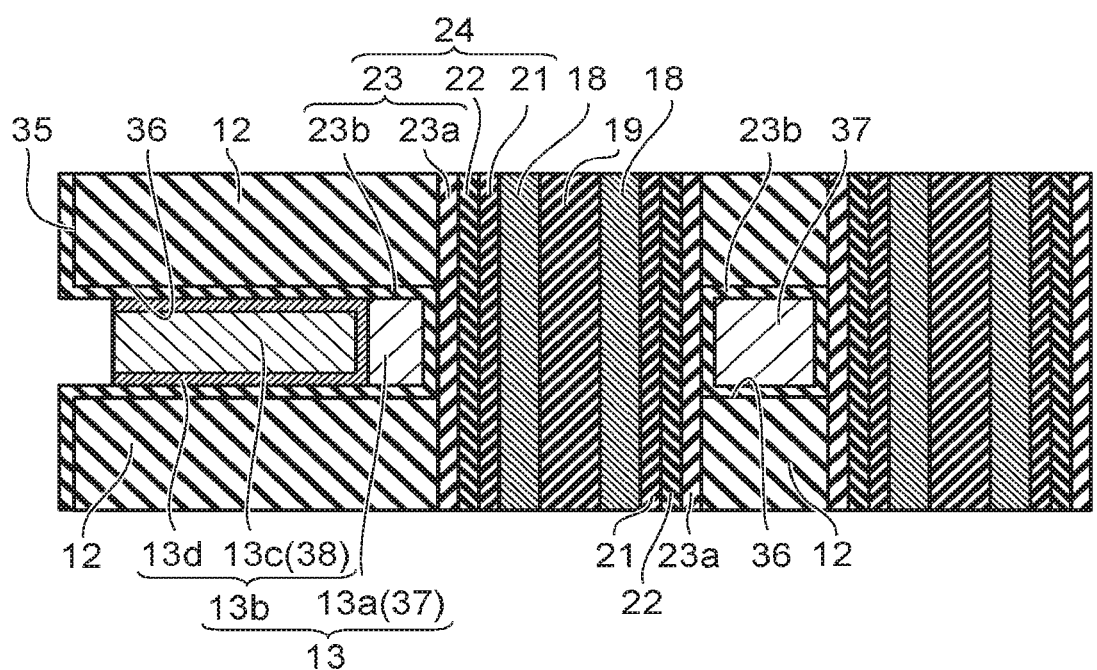

Then, as shown in FIG. 5D and FIG. 6B, the barrier metal layer 13d that is made of, for example, titanium nitride is formed via the slit 35 on the side surface of the slit 35, on the inner surfaces of the spaces 36, and on the exposed surfaces of the silicon films 37. Then, a tungsten film 38 is filled into the two X-direction end parts of the spaces 36 by depositing, for example, tungsten on the barrier metal layer 13d.

Then, the portions of the tungsten film 38 and the barrier metal layer 13d that are deposited on the inner surface of the slit 35 are removed; and the tungsten film 38 and the barrier metal layer 13d are divided for each of the spaces 36. Thereby, the electrode films 13 are formed. At this time, the silicon films 37 become the central portions 13a of the electrode films 13; and the tungsten films 38 become the main body units 13c of the peripheral portions 13b of the electrode films 13. Thus, the sacrificial films 31 (referring to FIG. 4D) are replaced with the electrode films 13. Thereby, the partial stacked bodies 14y become the partial stacked bodies 14a.

Then, as shown in FIG. 1 and FIG. 2, the insulating members 17 are formed on the side surfaces of the slit 35 by depositing an insulating material. Then, the source electrode 16 is formed inside the slit 35 by depositing a conductive material on the side surfaces of the insulating members 17. The interior of the slit 35 is filled with the insulating members 17 and the source electrode 16.

Then, the inter-layer insulating film 25 is formed on the stacked body 14. Then, plug holes are made in the inter-layer insulating film 25 in the regions directly above the silicon pillars 18; and the plugs 26 are filled into the plug holes. Then, the bit lines 27 that extend in the X-direction are formed on the inter-layer insulating film 25. Subsequently, dicing of the silicon wafer is performed to cut the silicon wafer into the multiple semiconductor memory devices 1. Thus, the semiconductor memory device 1 according to the embodiment is manufactured.

Effects of the embodiment will now be described.

In the semiconductor memory device 1 according to the embodiment, the electrode film 13 has a double structure. Namely, the central portion 13a of the electrode film 13 is formed of silicon; and the peripheral portion 13b is formed mainly of tungsten. The peripheral portion 13b extends in the Y-direction. Thereby, the interconnect resistance of the electrode film 13 along the Y-direction can be suppressed to be low; and the total amount of tungsten can be reduced. Thereby, the warp of the silicon wafer in the manufacturing processes can be reduced; and the handling and the process precision can be increased. As a result, the productivity of the semiconductor memory device 1 can be increased.

If the entire electrode film 13 is formed of tungsten, the total amount of tungsten deposited on the silicon wafer increases. In such a case, the wafer undesirably warps to be convex downward because the tungsten applies compressive stress to the periphery. Thereby, the handling of the wafer becomes difficult; and the precision of the process decreases. For example, even when the wafer is to be held by suction of the back surface of the wafer to a holder by a vacuum chuck, the vacuum chuck does not function well because a gap is made between the holder and the peripheral portion of the wafer. Also, even in the case where a pattern including an alignment mark is formed in a first process, the wafer subsequently warps undesirably due to the stress of the tungsten in a second process, and the focus is to be aligned in a subsequent third process including lithography by viewing the alignment mark formed in the first process, the alignment mark undesirably appears to be distorted because the wafer warps in the second process; and it becomes difficult to align the focus with high precision. Therefore, the precision of the lithography undesirably decreases.

Conversely, because the stress of silicon is smaller than the stress of tungsten, by forming a portion of the electrode film 13 of silicon as in the embodiment, the warp of the wafer can be suppressed by reducing the stress of the entire electrode film 13.

Also, although it also may be considered to reduce the total amount of tungsten by setting the electrode film 13 to be thin, when doing so, the gate length of the memory cell transistor becomes undesirably short; and the leakage current of the memory cell transistor becomes undesirably large.

Further, although it also may be considered to form the entire electrode film 13 of silicon, when doing so, the interconnect resistance of the electrode film 13 increases; and the increased operation speed of the semiconductor memory device 1 is undesirably obstructed.

Also, in the semiconductor memory device 1 according to the embodiment, all of the silicon pillars 18 pierce the central portions 13a of the electrode films 13. Thereby, compared to the case where a portion of the silicon pillars 18 pierce the central portions 13a made of silicon and the remaining silicon pillars 18 pierce the peripheral portions 13b made of tungsten, the characteristics of the memory cell transistors can be uniform.

Further, in the semiconductor memory device 1 according to the embodiment as shown in FIG. 3, even in the case where the width of the slit 35 changes in the Z-direction, the width of the peripheral portion 13b is substantially uniform in the Z-direction. In other words, as shown in FIG. 3, the distance c1 at the position p1 is substantially equal to the distance c2 at the position p2. Thereby, the interconnect resistance of the electrode film 13 can be made uniform in the Z-direction.

Modification of First Embodiment

A modification of the first embodiment will now be described.

The drawings showing the semiconductor memory device according to the modification are similar to FIG. 1 and FIG. 2 described above.

The semiconductor memory device according to the modification differs from the semiconductor memory device 1 according to the first embodiment described above (referring to FIG. 1 and FIG. 2) in that the central portion 13a of the electrode film 13 is formed of a metal silicide. The metal silicide is, for example, nickel silicide or cobalt silicide.

A method for manufacturing the semiconductor memory device according to the modification will now be described.

FIG. 7A to FIG. 7C and FIG. 8A to FIG. 8C are cross-sectional views showing the method for manufacturing the semiconductor memory device according to the modification.

First, the processes shown in FIG. 4A to FIG. 5A are implemented.

Figure 7A:
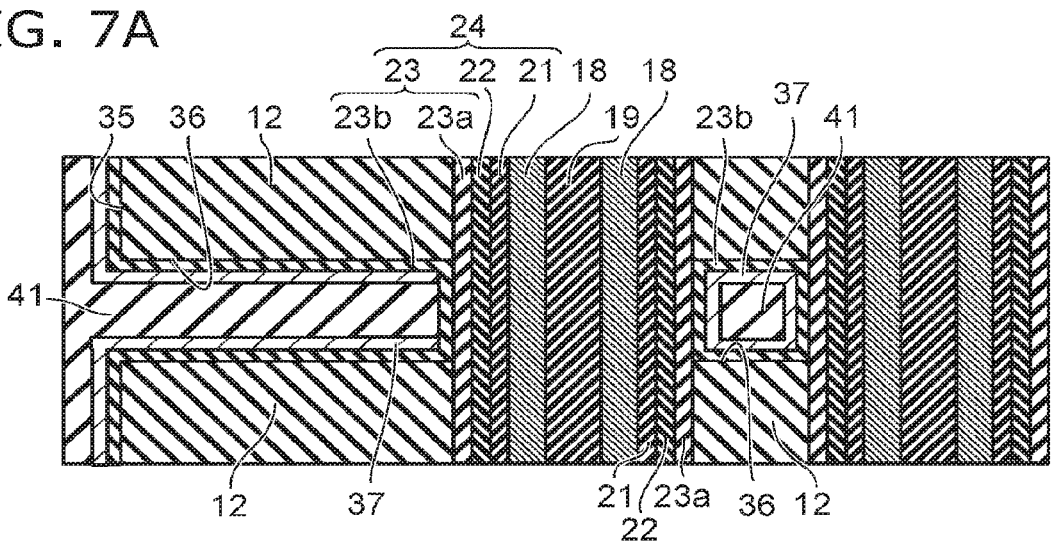

Then, as shown in FIG. 7A, the aluminum oxide layer 23b is formed on the side surface of the slit 35 and on the inner surfaces of the spaces 36. Then, the silicon film 37 is formed on the aluminum oxide layer 23b by depositing amorphous silicon by, for example, CVD. At this time, the silicon film 37 is formed to be thinner than that of the first embodiment described above so that the silicon film 37 does not completely fill the spaces 36. Then, a silicon oxide film 41 is formed on the silicon film 37. The silicon oxide film 41 fills the spaces 36.

Figure 7B:
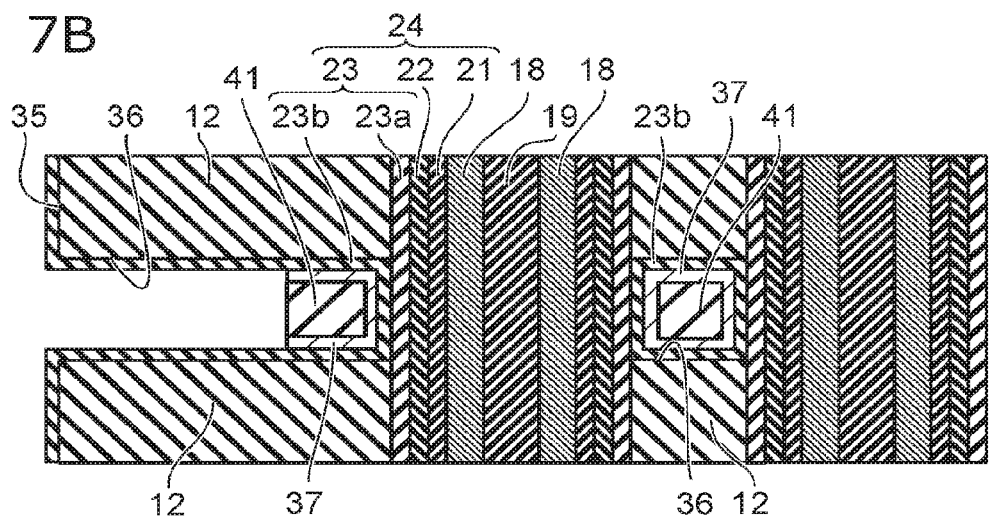

Then, as shown in FIG. 7B, the silicon oxide film 41 is recessed via the slit 35 by performing isotropic etching such as wet etching, etc. Thereby, the silicon oxide film 41 is removed from the X-direction peripheral parts of the spaces 36 and remains in the X-direction central parts of the spaces 36. Then, the portions of the silicon film 37 not covered with the silicon oxide films 41 are removed by performing isotropic etching such as wet etching, etc. Thereby, the silicon film 37 is removed from the X-direction peripheral parts of the spaces 36 and remains in the X-direction central parts of the spaces 36.

Figure 7C:
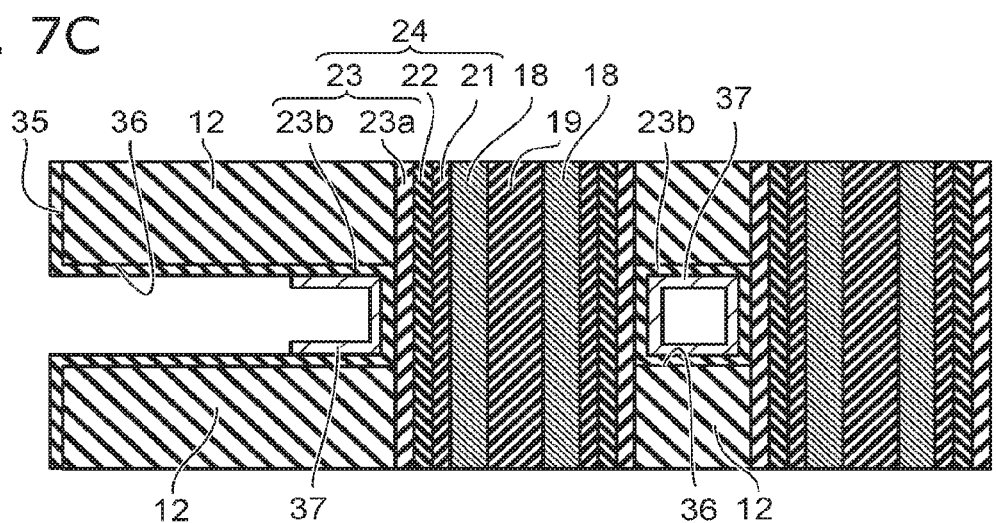

Then, as shown in FIG. 7C, the silicon oxide films 41 are removed from inside the spaces 36 via the slit 35 by performing isotropic etching such as wet etching, etc. Thereby, the silicon films 37 that remain inside the X-direction central parts of the spaces 36 are exposed.

Then, as shown in FIG. 8A, a metal film 42 is formed inside the spaces 36 by depositing a metal, e.g., nickel (Ni) or cobalt (Co). The metal film 42 contacts the silicon films 37.

Then, as shown in FIG. 8B, heat treatment such as, for example, RTA (rapid thermal anneal), etc., is performed. Thereby, the silicon films 37 and the metal film 42 react inside the X-direction central parts of the spaces 36; and metal silicide films 43 are formed. Then, the unreacted metal film 42 (FIG. 8A) is removed by performing wet etching using sulfuric acid-hydrogen peroxide. Thereby, the central portions 13a that are made of a metal silicide are formed inside the X-direction central parts of the spaces 36.

Then, as shown in FIG. 8C, the barrier metal layer 13d that is made of titanium nitride is formed on the inner surfaces of the slit 35 and the spaces 36; the tungsten film 38 is formed; and the tungsten film and the barrier metal layer 13d are caused to remain inside the two X-direction end parts of the spaces 36 by recessing the tungsten film and the barrier metal layer 13d. Thereby, the tungsten films 38 become the main body units 13c; and the peripheral portions 13b of the electrode films 13 are formed. The subsequent manufacturing method is similar to that of the first embodiment described above.

Effects of the modification will now be described.

By forming the central portion 13a of the electrode film 13 of a metal silicide in the modification, the interconnect resistance of the electrode film 13 can be reduced further compared to the first embodiment described above. Also, because the stress of the metal silicide is smaller than the stress of the tungsten, the warp of the wafer can be reduced compared to the case where the entire electrode film 13 is formed of tungsten.

Otherwise, the configuration, the manufacturing method, the operations, and the effects of the modification are similar to those of the first embodiment described above.

Second Embodiment

A second embodiment will now be described.

Figure 9:
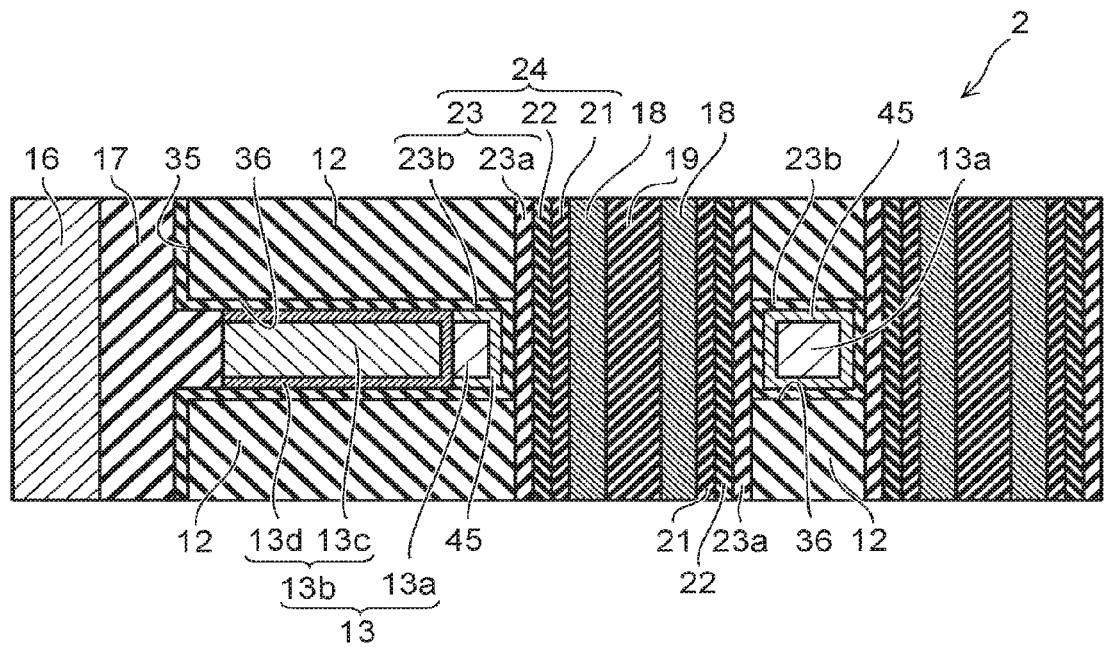
FIG. 9 is a cross-sectional view showing a semiconductor memory device according to a second embodiment.

FIG. 9 is a cross-sectional view showing a semiconductor memory device according to the embodiment.

As shown in FIG. 9, the semiconductor memory device 2 according to the embodiment differs from the semiconductor memory device according to the first embodiment described above (referring to FIG. 1 and FIG. 2) in that a barrier metal layer 45 is provided between the aluminum oxide layer 23b and the central portion 13a of the electrode film 13. The central portion 13a is made of silicon; and the barrier metal layer 45 is made of, for example, a metal nitride such as titanium nitride (TiN), tantalum nitride (TaN), etc.

A method for manufacturing the semiconductor memory device according to the embodiment will now be described.

Figure 10:
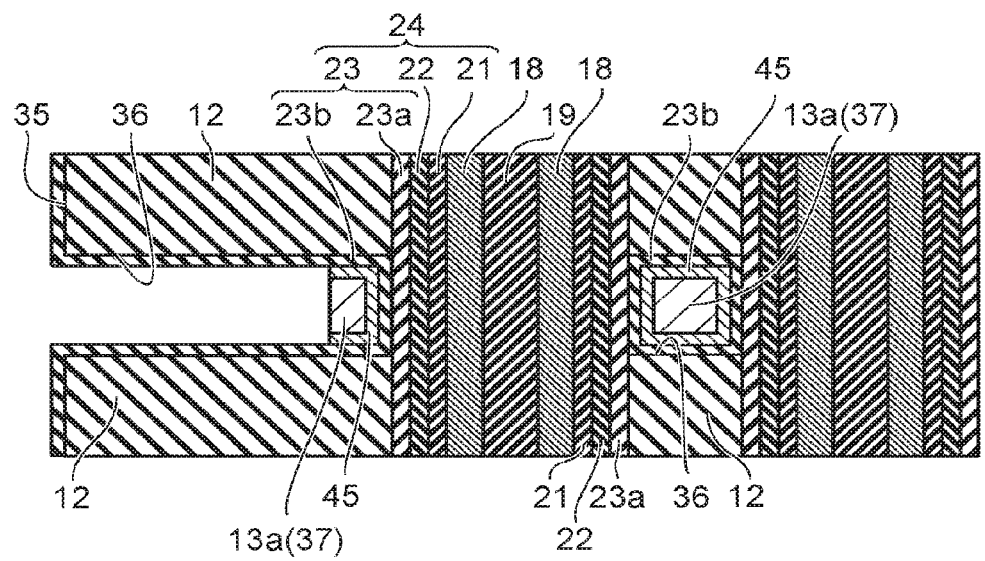
FIG. 10 is a cross-sectional view showing a method for manufacturing the semiconductor memory device according to the second embodiment.

FIG. 10 is a cross-sectional view showing the method for manufacturing the semiconductor memory device according to the embodiment.

First, the processes shown in FIG. 4A to FIG. 5A are implemented.

Then, as shown in FIG. 10, the aluminum oxide layer 23b is formed on the side surface of the slit 35 and on the inner surfaces of the spaces 36. Then, the barrier metal layer 45 is formed on the aluminum oxide layer 23b by depositing a metal nitride such as titanium nitride, tungsten nitride, etc. Then, the silicon film 37 is formed on the barrier metal layer 45 by depositing amorphous silicon by, for example, CVD to fill the interiors of the spaces 36.

Then, the silicon film 37 is recessed and removed from the two X-direction end parts of the spaces 36 by performing isotropic etching. Then, the barrier metal layer 45 is recessed and removed from the two X-direction end parts of the spaces 36 by performing isotropic etching. The subsequent processes are similar to those of the first embodiment described above.

Effects of the embodiment will now be described.

According to the embodiment, by providing the barrier metal layer 45 between the aluminum oxide layer 23b and the central portion 13a made of silicon, mutual diffusion and reactions between silicon and aluminum oxide can be suppressed reliably. Also, because the work function of the metal material included in the barrier metal layer 45 is larger than the work function of silicon, the leakage current flowing from the electrode film 13 into the charge storage film 22 can be suppressed.

Otherwise, the configuration, the manufacturing method, the operations, and the effects of the embodiment are similar to those of the first embodiment described above.

Modification of Second Embodiment

A modification of the second embodiment will now be described.

The drawing showing the semiconductor memory device according to the modification is similar to FIG. 9 described above.

The modification is an example in which the second embodiment and the modification of the first embodiment described above are combined. Namely, the semiconductor memory device according to the modification differs from the semiconductor memory device 2 according to the second embodiment described above (referring to FIG. 9) in that the central portion 13a of the electrode film 13 is formed of a metal silicide. The metal silicide is, for example, nickel silicide or cobalt silicide.

A method for manufacturing the semiconductor memory device according to the modification will now be described.

FIG. 11A to FIG. 11C, FIG. 12A, and FIG. 12B are cross-sectional views showing the method for manufacturing the semiconductor memory device according to the modification.

First, the processes shown in FIG. 4A to FIG. 5A are implemented.

Figure 11A:
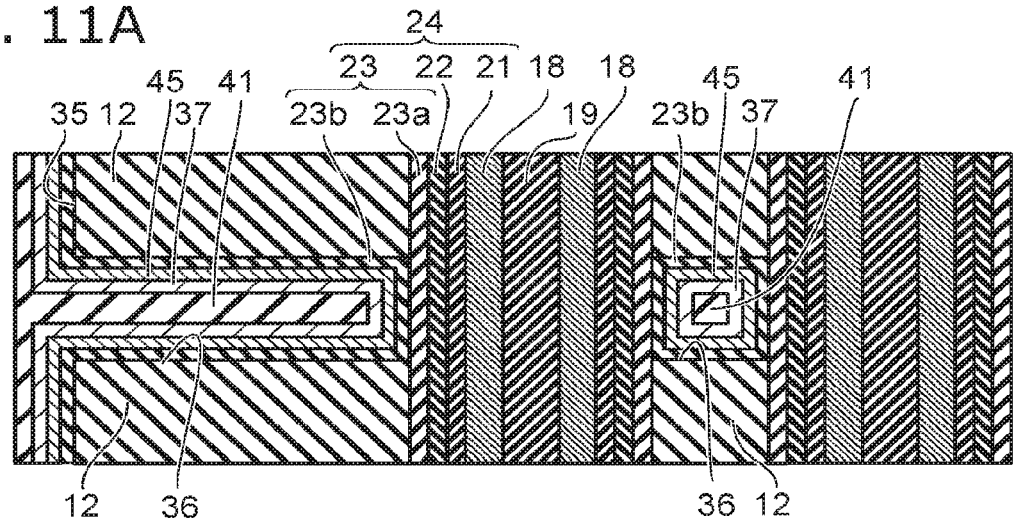
FIG. 11A to FIG. 12B are cross-sectional views showing a method for manufacturing a semiconductor memory device according to a modification of the second embodiment.

Then, as shown in FIG. 11A, the aluminum oxide layer 23b is formed on the side surface of the slit 35 and on the inner surfaces of the spaces 36. Then, the barrier metal layer 45 is formed on the aluminum oxide layer 23b by depositing a metal nitride such as titanium nitride, tungsten nitride, etc. Then, the silicon film 37 is formed on the barrier metal layer 45 by depositing amorphous silicon by, for example, CVD. At this time, the silicon film 37 is formed so that the silicon film 37 does not completely fill the spaces 36. Then, the silicon oxide film 41 is formed on the silicon film 37; and the spaces 36 are filled.

Figure 11B:
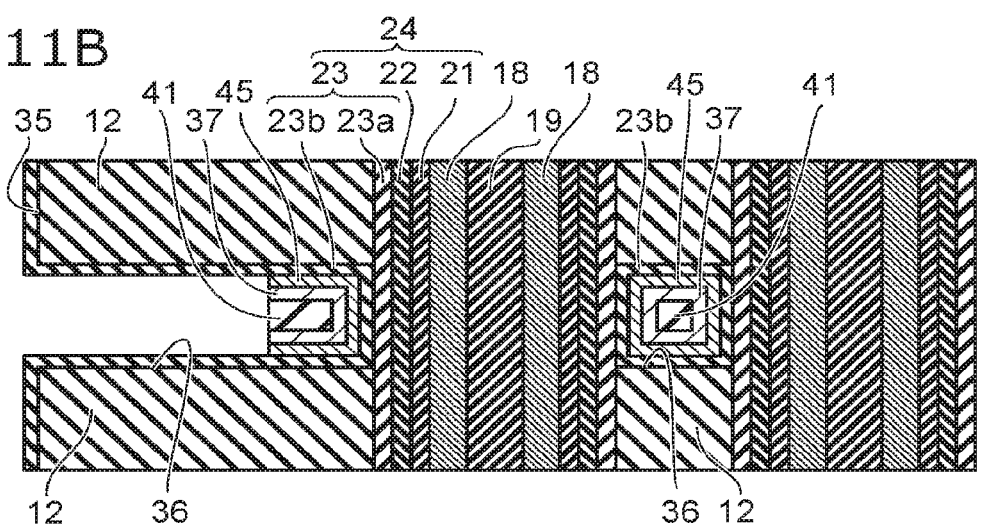

Then, as shown in FIG. 11B, the silicon oxide film 41 is recessed via the slit 35. Then, the silicon film 37 is recessed via the slit 35. Then, the barrier metal layer 45 is recessed via the slit 35 by performing isotropic etching such as wet etching, etc. Thereby, the silicon oxide film 41, the silicon film 37, and the barrier metal layer 45 are removed from the X-direction peripheral parts of the spaces 36 but remain in the X-direction central parts of the spaces 36.

Figure 11C:
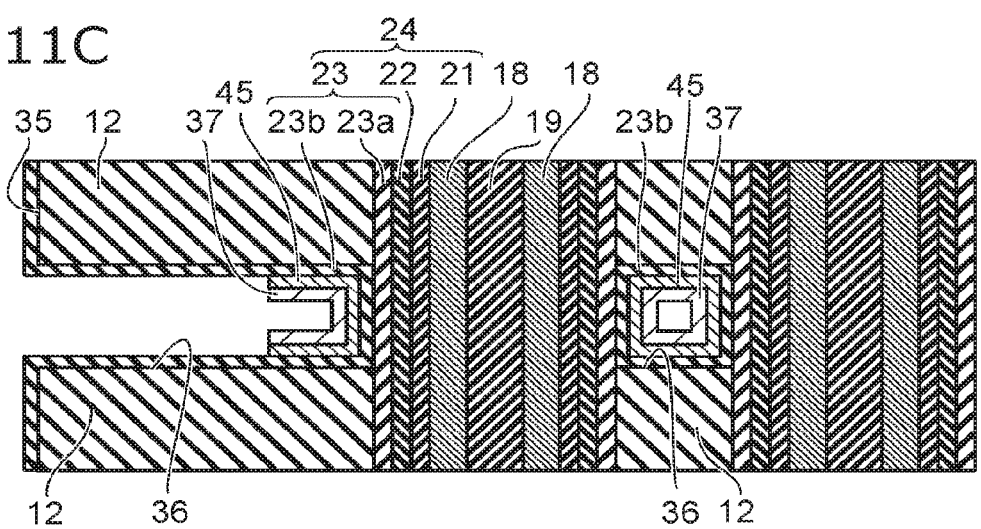

Then, as shown in FIG. 11C, the silicon oxide films 41 are removed from the interiors of the spaces 36 via the slit 35 by performing isotropic etching such as wet etching, etc. Thereby, the silicon films 37 that remain inside the X-direction central parts of the spaces 36 are exposed.

Figure 12A:
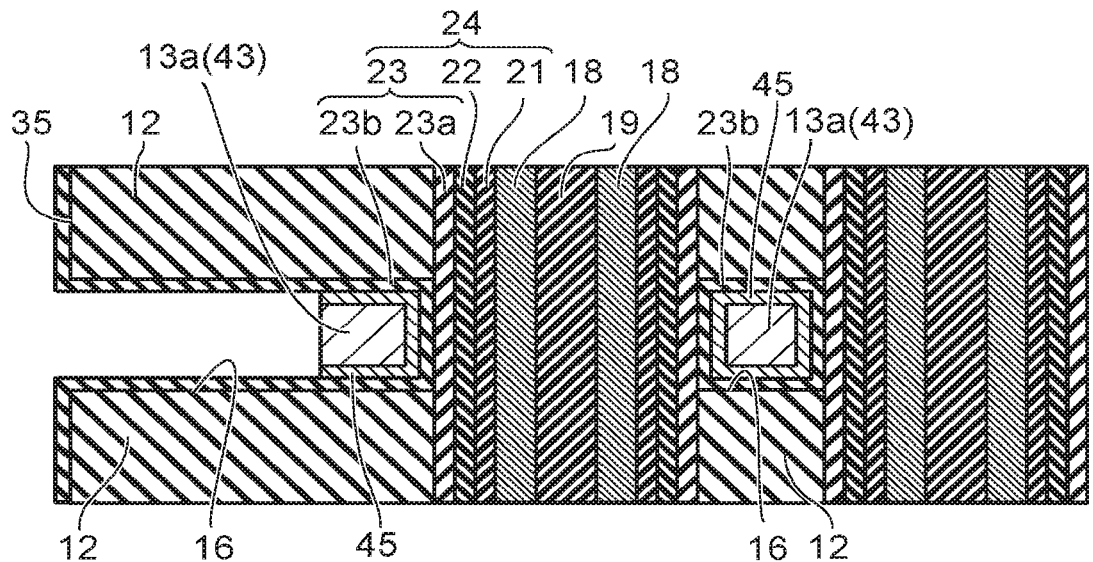

Then, as shown in FIG. 12A, the metal film 42 (referring to FIG. 8A) is formed inside the spaces 36 by depositing a metal, e.g., nickel or cobalt. The metal film 42 contacts the silicon films 37. Then, for example, heat treatment such as RTA, etc., is performed. Thereby, the silicon films 37 and the metal film 42 react; and the metal silicide films 43 are formed. Then, the unreacted metal film 42 is removed by performing wet etching using sulfuric acid-hydrogen peroxide. Thereby, the central portions 13a that are made of a metal silicide are formed inside the X-direction central parts of the spaces 36.

Figure 12B:
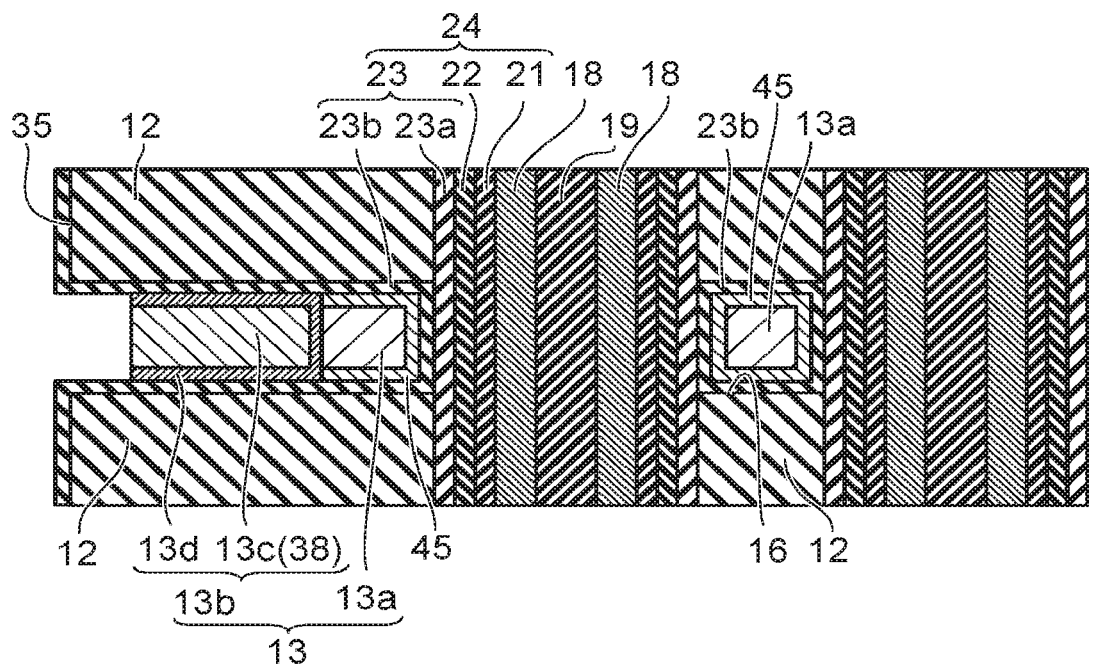

Then, as shown in FIG. 12B, the barrier metal layer 13d that is made of titanium nitride is formed on the inner surfaces of the slit 35 and the spaces 36; and the tungsten film 38 is formed. Then, the tungsten film and the barrier metal layer 13d are caused to remain inside the two X-direction end parts of the spaces 36 by recessing the tungsten film and the barrier metal layer 13d. Thereby, the tungsten films 38 become the main body units 13c; and the peripheral portions 13b of the electrode films 13 are formed. The subsequent manufacturing method is similar to that of the first embodiment described above.

Effects of the modification will now be described.

In the modification, by forming the central portion 13a of the electrode film 13 of a metal silicide, the interconnect resistance of the electrode film 13 can be reduced further compared to the second embodiment described above while suppressing the warp of the wafer.

Otherwise, the configuration, the manufacturing method, the operations, and the effects of the modification are similar to those of the second embodiment described above.

Third Embodiment

A third embodiment will now be described.

Figure 13:
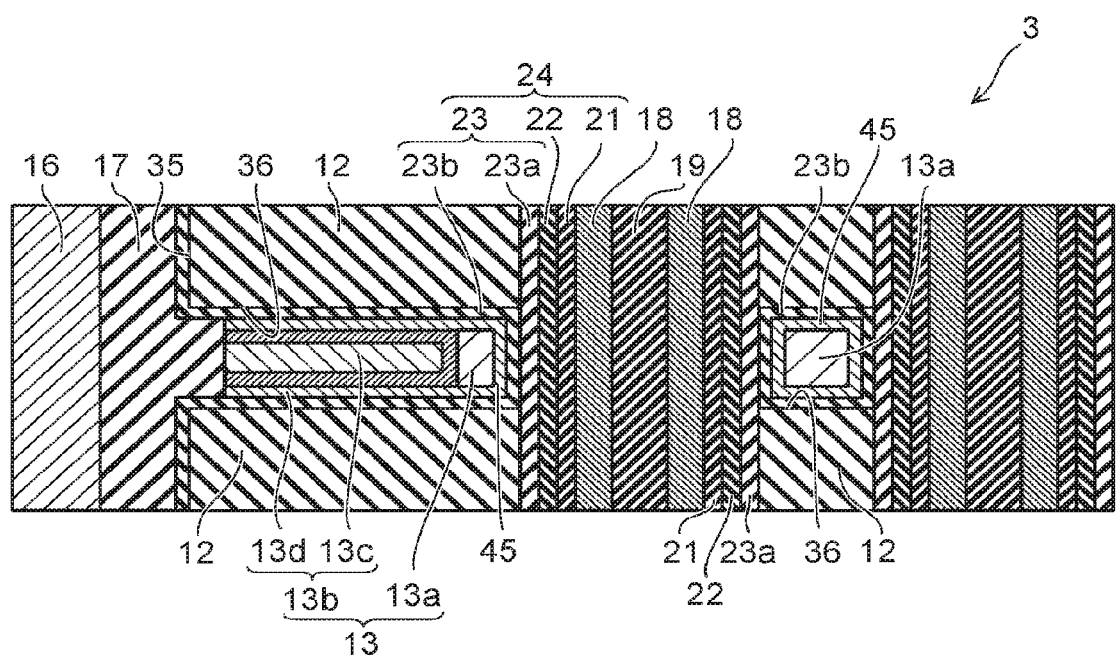
FIG. 13 is a cross-sectional view showing a semiconductor memory device according to a third embodiment.

FIG. 13 is a cross-sectional view showing a semiconductor memory device according to the embodiment.

As shown in FIG. 13, the semiconductor memory device 3 according to the embodiment differs from the semiconductor memory device according to the second embodiment described above (referring to FIG. 9) in that the barrier metal layer 45 is provided also between the aluminum oxide layer 23b and the peripheral portion 13b of the electrode film 13. In other words, the barrier metal layer 45 is provided between the aluminum oxide layer 23b and the entire electrode film 13.

A method for manufacturing the semiconductor memory device according to the embodiment will now be described.

Figure 14A:
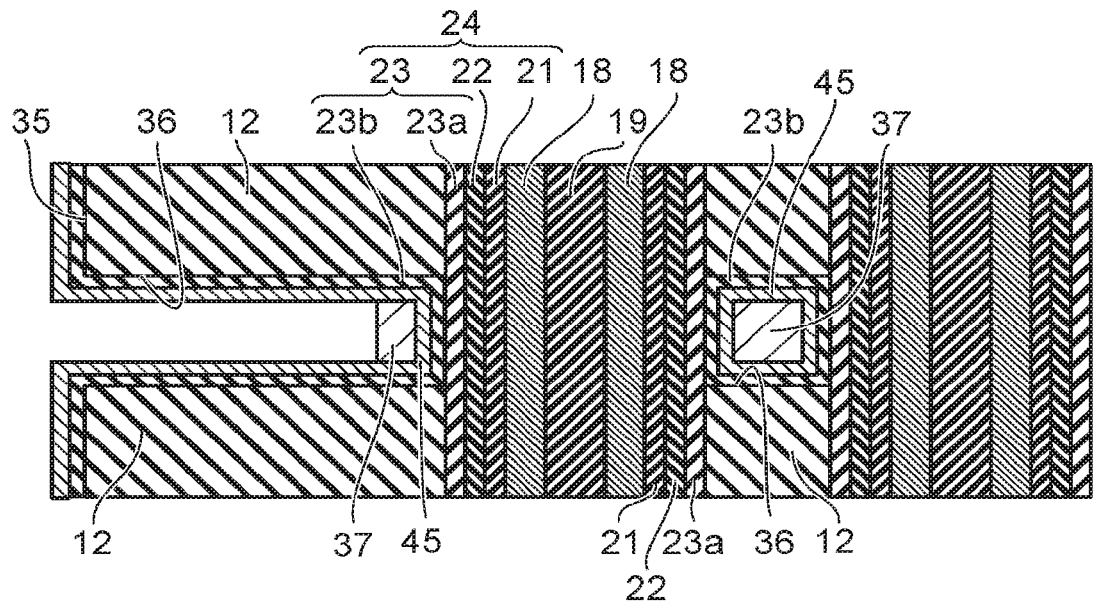
FIG. 14A and FIG. 14B are cross-sectional views showing a method for manufacturing the semiconductor memory device according to the third embodiment.
Figure 14B:
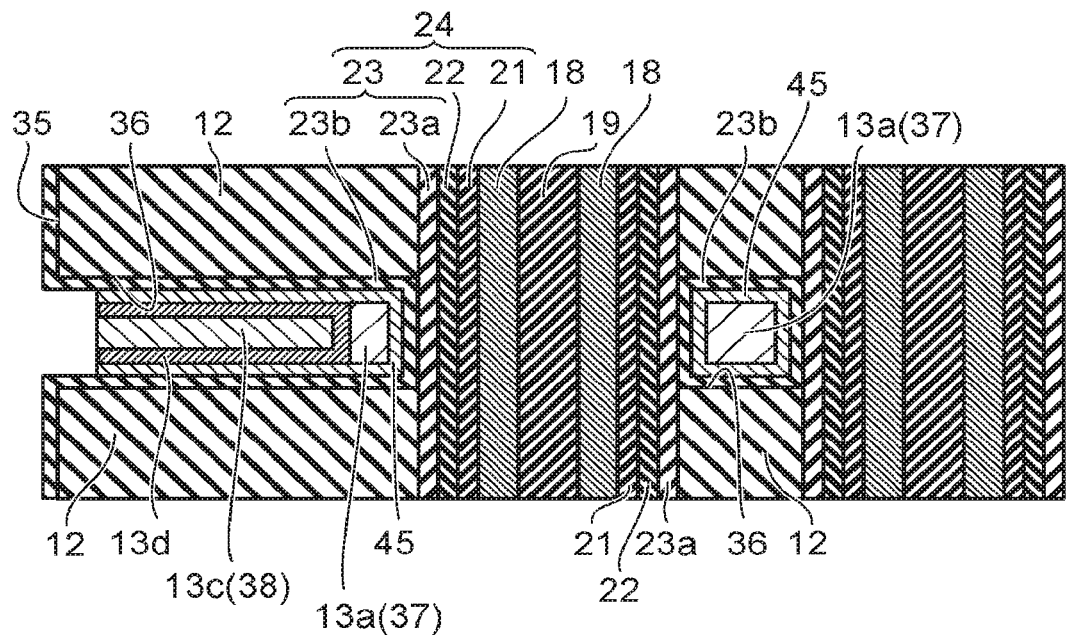

FIG. 14A and FIG. 14B are cross-sectional views showing the method for manufacturing the semiconductor memory device according to the embodiment.

First, the processes shown in FIG. 4A to FIG. 5A are implemented.

Then, as shown in FIG. 14A, the aluminum oxide layer 23b is formed on the side surface of the slit 35 and on the inner surfaces of the spaces 36; and subsequently, the barrier metal layer 45 is formed. Then, the interiors of the spaces 36 are filled by forming the silicon film 37 on the aluminum oxide layer 23b by, for example, CVD. Then, the silicon film 37 is recessed by performing isotropic etching and caused to remain in the X-direction central parts of the spaces 36. At this time, the barrier metal layer 45 is not recessed.

Then, as shown in FIG. 14B, the barrier metal layer 13d and the tungsten film 38 are formed on the inner surfaces of the slit 35 and the spaces 36. Then, the tungsten film 38 is removed from inside the slit 35 and caused to remain inside the spaces 36 by recessing. Then, the barrier metal layer 13d is removed from inside the slit 35 and caused to remain inside the spaces 36 by recessing. Then, the barrier metal layer 45 is removed from inside the slit 35 and caused to remain inside the spaces 36 by recessing. Thereby, the exposed surfaces of the tungsten films 38, the barrier metal layers 13d, and the barrier metal layers 45 recede to substantially the same position. The subsequent processes are similar to those of the first embodiment described above.

Otherwise, the configuration, the manufacturing method, the operations, and the effects of the embodiment are similar to those of the first embodiment described above.

First Modification of Third Embodiment

A first modification of the third embodiment will now be described.

The drawing showing the semiconductor memory device according to the modification is similar to FIG. 13 described above.

The modification is an example in which the third embodiment and the modification of the first embodiment described above are combined. Namely, the semiconductor memory device according to the modification differs from the semiconductor memory device 2 according to the third embodiment described above (referring to FIG. 13) in that the central portion 13a of the electrode film 13 is formed of a metal silicide.

A method for manufacturing the semiconductor memory device according to the modification will now be described.

FIG. 15A to FIG. 15C, FIG. 16A, and FIG. 16B are cross-sectional views showing the method for manufacturing the semiconductor memory device according to the modification.

First, the processes shown in FIG. 4A to FIG. 5A are implemented.

Figure 15A:
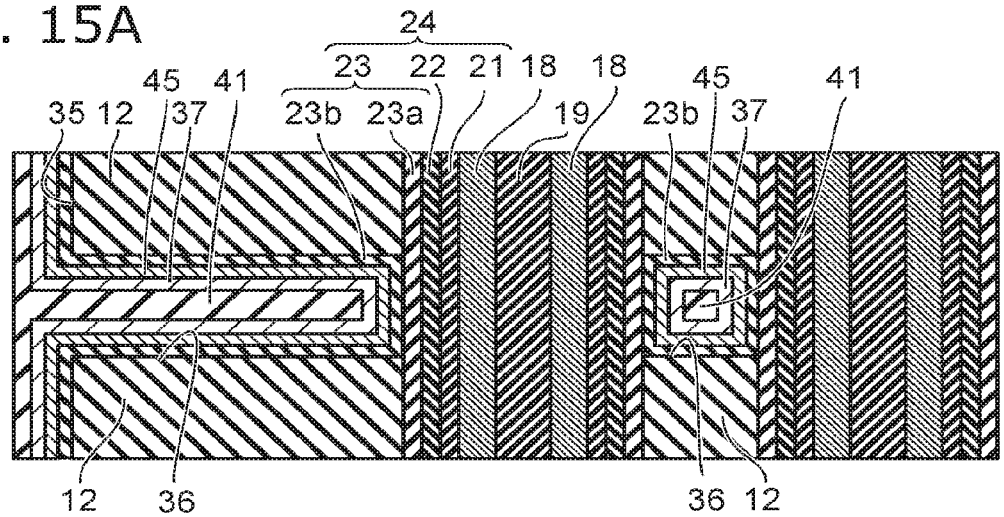
FIG. 15A to FIG. 16B are cross-sectional views showing a method for manufacturing a semiconductor memory device according to a first modification of the third embodiment.

Then, as shown in FIG. 15A, the aluminum oxide layer 23b, the barrier metal layer 45, the silicon film 37, and the silicon oxide film 41 are formed in this order on the side surface of the slit 35 and on the inner surfaces of the spaces 36.

Figure 15B:
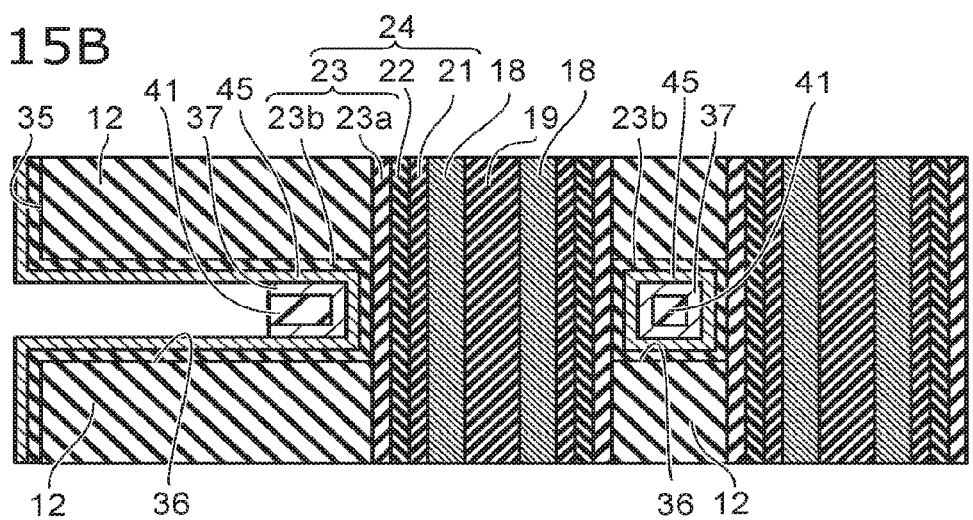

Then, as shown in FIG. 15B, the silicon oxide film 41 is recessed via the slit 35. Then, the silicon film 37 is recessed via the slit 35. At this time, the barrier metal layer 45 is not recessed.

Figure 15C:
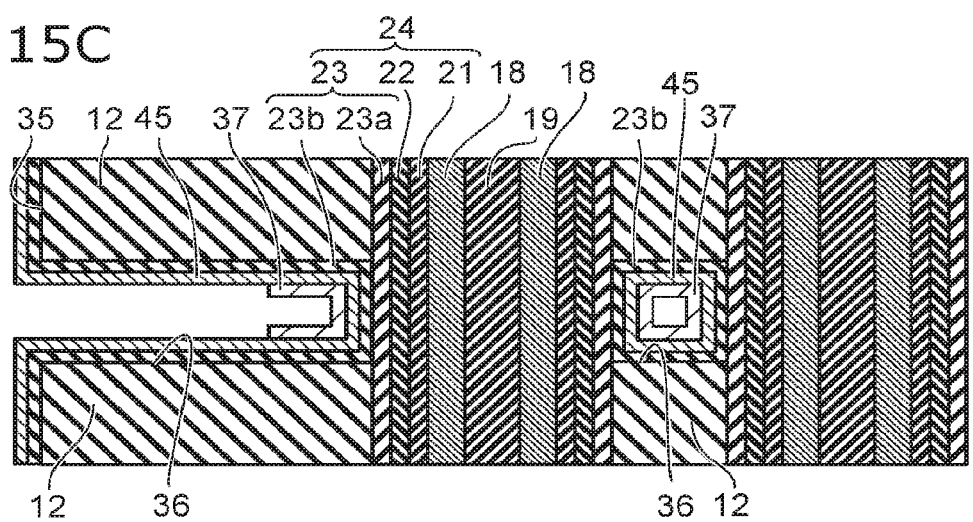

Then, as shown in FIG. 15C, the silicon oxide film 41 is removed from inside the spaces 36 via the slit 35. Thereby, the silicon films 37 that remain inside the X-direction central parts of the spaces 36 are exposed.

Figure 16A:
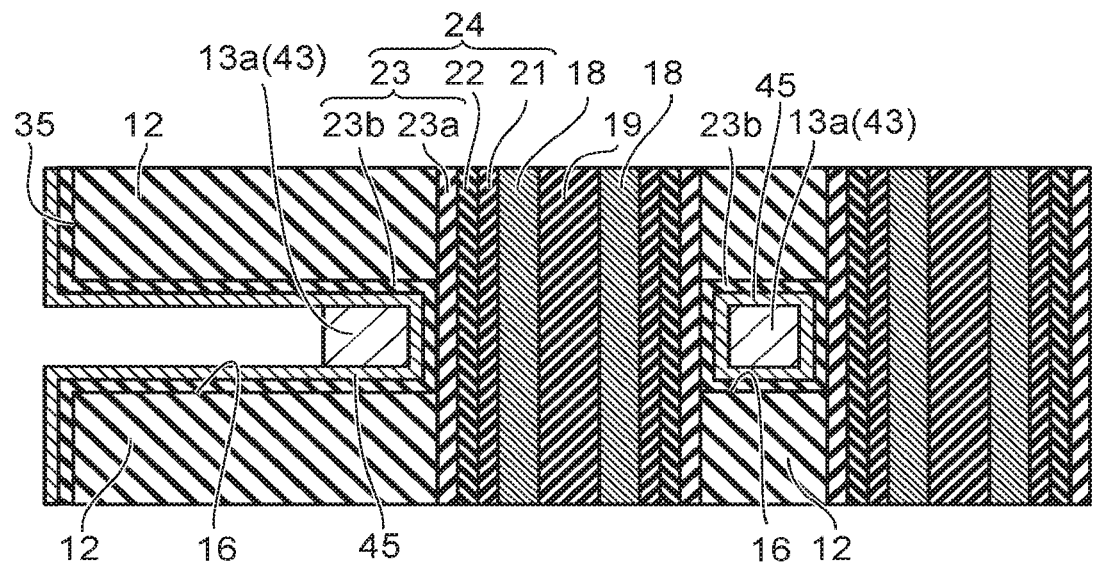

Then, as shown in FIG. 16A, the metal film 42 (referring to FIG. 8A) is formed inside the spaces 36 by depositing a metal, e.g., nickel or cobalt. Then, the metal silicide films 43 are formed by causing the silicon films 37 and the metal film 42 to react by performing heat treatment such as, for example, RTA, etc. Then, the unreacted metal film 42 is removed by performing wet etching using sulfuric acid-hydrogen peroxide. Thereby, the central portions 13a that are made of a metal silicide are formed inside the X-direction central parts of the spaces 36.

Figure 16B:
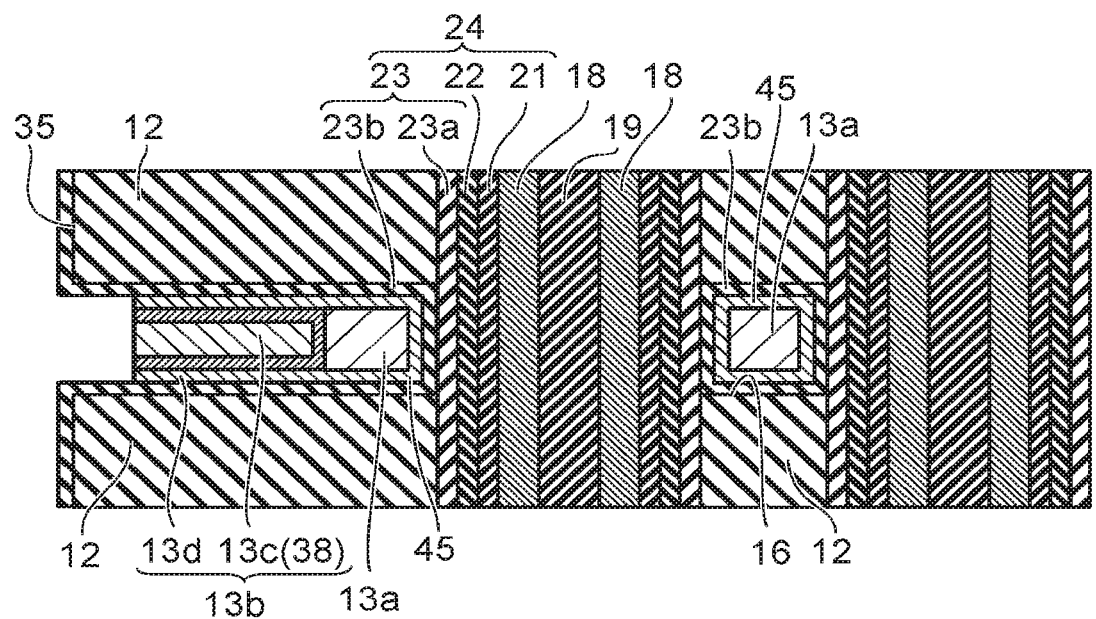

Then, as shown in FIG. 16B, on the inner surfaces of the slit 35 and the spaces 36, a barrier metal layer 13d that is made of titanium nitride is formed; and the tungsten film 38 is formed. Then, the tungsten film, the barrier metal layer 13d, and the barrier metal layer 45 are caused to remain inside the two X-direction end parts of the spaces 36 by recessing. The subsequent manufacturing method is similar to that of the first embodiment described above.

Effects of the modification will now be described.

According to the modification, the interconnect resistance of the electrode film 13 can be reduced further compared to the third embodiment described above.

Otherwise, the configuration, the manufacturing method, the operations, and the effects of the modification are similar to those of the third embodiment described above.

Second Modification of Third Embodiment

A second modification of the third embodiment will now be described.

Figure 17:
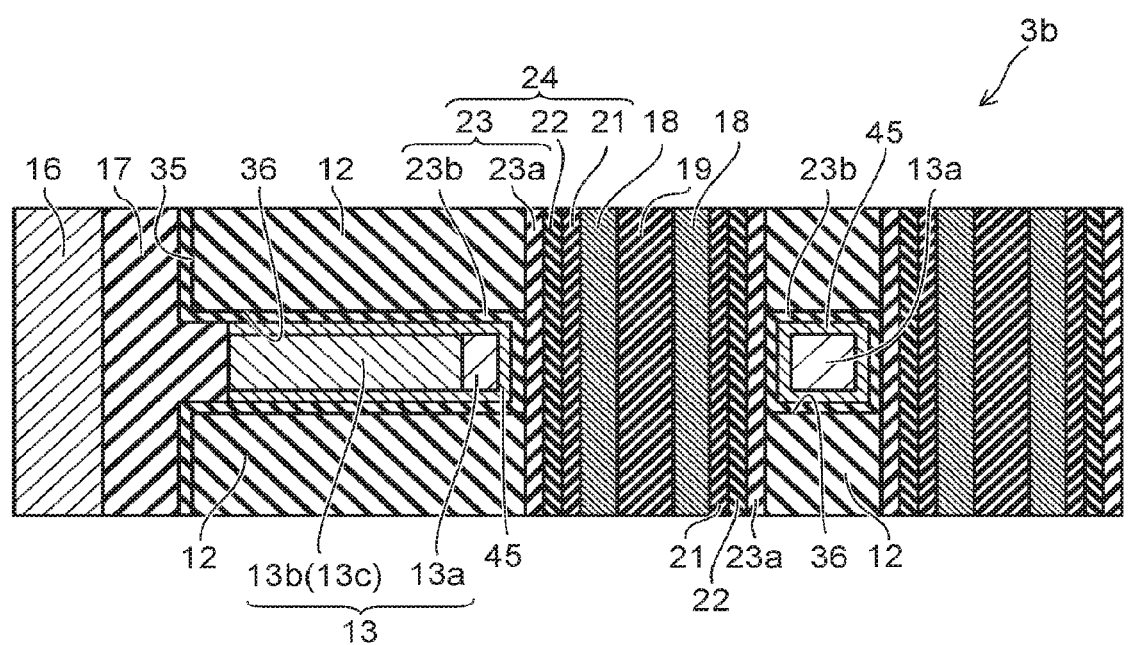
FIG. 17 is a cross-sectional view showing a semiconductor memory device according to a second modification of the third embodiment.

FIG. 17 is a cross-sectional view showing a semiconductor memory device according to the modification.

As shown in FIG. 17, the semiconductor memory device 3b according to the modification differs from the semiconductor memory device according to the second embodiment described above in that the barrier metal layer 13d (referring to FIG. 13) is not provided. In other words, in the modification, the aluminum oxide layer 23b is provided on the inner surfaces of the spaces 36; the barrier metal layer 45 that is made of a metal nitride is provided on the aluminum oxide layer 23b; and the electrode film 13 is provided on the barrier metal layer 45 to fill the interiors of the spaces 36. The central portion 13a of the electrode film 13 is made of a metal silicide; and the peripheral portion 13b (the main body unit 13c) is made of tungsten. The central portion 13a that is made of the metal silicide and the main body unit 13c that is made of tungsten contact each other.

Effects of the modification will now be described.

According to the modification, because the barrier metal layer 13d (referring to FIG. 13) is not provided in the peripheral portion 13b of the electrode film 13, the main body unit 13c can be set to be thicker by this amount; and the interconnect resistance of the electrode film 13 can be reduced further.

Also, in the modification, the productivity of the semiconductor memory device 3b is high because the process of forming the barrier metal layer 13d and the process of recessing the barrier metal layer 13d can be omitted.

Otherwise, the configuration, the manufacturing method, the operations, and the effects of the modification are similar to those of the first modification of the third embodiment described above.

Although an example is illustrated in the embodiments described above in which the central portion 13a of the electrode film 13 is formed of silicon or a metal silicide, this is not limited thereto; and, for example, the central portion 13a of the electrode film 13 may be formed of a nitride of a metal. Also, a portion of the central portion 13a may be formed of silicon; and the remainder may be formed of a metal silicide or a metal nitride.

According to the embodiments described above, a semiconductor memory device having high productivity can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device, comprising:
    a first stacked body, the first stacked body including a plurality of electrode films and a plurality of inter-layer insulating films stacked alternately along a first direction, the plurality of electrode films and the plurality of inter-layer insulating films extending in a second direction intersecting the first direction;
    a plurality of semiconductor pillars extending in the first direction and piercing the first stacked body; and
    a memory film disposed between one of the semiconductor pillars and one of the electrode films,
    each of the electrode films including
        a central portion disposed in a central part in a third direction, the central portion including silicon, the third direction intersecting the first direction and the second direction, and
        a peripheral portion disposed on two sides of the central portion in the third direction, the peripheral portion extending in the second direction and including a metal;
    wherein one of the semiconductor pillars pierces the central portion
    a second stacked body separated from the first stacked body and arranged in the third direction as viewed from the first stacked body, the second stacked body including a plurality of other electrode films and a plurality of other inter-layer insulating films stacked alternately along the first direction, the plurality of other electrode films and the plurality of other inter-layer insulating films extending in the second direction; and
    a distance between a first interface and the semiconductor pillar most proximal to the first interface at a first position being shorter than a distance between a second interface and the semiconductor pillar most proximal to the second interface at a second position in the case where a distance between the first stacked body and the second stacked body at the first position in the first direction is longer than a distance between the first stacked body and the second stacked body at the second position in the first direction, the second position being different from the first position, the first interface being between the central portion and the peripheral portion at the first position, the second interface being between the central portion and the peripheral portion at the second position.

2. The semiconductor memory device according to claim 1, wherein the peripheral portion includes a portion made of tungsten.

3. The semiconductor memory device according to claim 1, wherein
    the peripheral portion includes:
        a main body unit made of a metal; and
        a first barrier metal layer made of a metal nitride.

4. The semiconductor memory device according to claim 1, further comprising a substrate,
    the first stacked body and the second stacked body being disposed on the substrate,
    the second position being positioned between the substrate and the first position.

5. The semiconductor memory device according to claim 1, wherein the central portion is made of silicon.

6. The semiconductor memory device according to claim 1, wherein the central portion is made of a metal silicide.

7. The semiconductor memory device according to claim 6, wherein the metal silicide is nickel silicide or cobalt silicide.

8. The semiconductor memory device according to claim 1, wherein
    the memory film includes:
        a first insulating film disposed on a side surface of the one of the semiconductor pillars; and
        a second insulating film disposed between the one of the electrode films and the inter-layer insulating films and between the one of the electrode films and the one of the semiconductor pillars.

* * * * *